United States Patent [19]
Park et al.

[11] Patent Number: 6,071,799
[45] Date of Patent: Jun. 6, 2000

[54] METHOD OF FORMING A CONTACT OF A SEMICONDUCTOR DEVICE

[75] Inventors: Cheol Soo Park; Chi Sun Hwang; Chang Hun Han, all of Kyoungki-do, Rep. of Korea

[73] Assignee: Hyundai Electronics Industries Co., Ltd., Ichon-shi, Rep. of Korea

[21] Appl. No.: 09/105,274

[22] Filed: Jun. 26, 1998

[30] Foreign Application Priority Data

Jun. 30, 1997 [KR] Rep. of Korea ............... 97-30200

[51] Int. Cl.[7] ............................................. H01L 21/4763
[52] U.S. Cl. .................... 438/595; 438/597; 438/620; 438/621
[58] Field of Search ................................. 438/597, 618, 438/620, 621, 639, 634, 596, 666, 668, 672, 675, 239, 253

[56] References Cited

U.S. PATENT DOCUMENTS

| | | | |
|---|---|---|---|
| 5,498,889 | 3/1996 | Hayden | 257/301 |
| 5,576,243 | 11/1996 | Wuu et al. | 437/195 |
| 5,610,083 | 3/1997 | Chan et al. | 437/21 |
| 5,643,833 | 7/1997 | Tsukamoto et al. | 437/195 |
| 5,710,073 | 1/1998 | Jeng et al. | 438/239 |
| 5,811,350 | 9/1998 | Dennison | 438/597 |

*Primary Examiner*—Chandra Chaudhari
*Assistant Examiner*—Renzo N. Rocchegiani
*Attorney, Agent, or Firm*—Jacobson, Price, Holman & Stern PLLC

[57] ABSTRACT

The present invention relates to a method of forming a contact of a semiconductor device, and more particularly, to a method of forming a contact of a semiconductor device that can improve the process yield of the device and reliability by simplifying the process of forming the contact hole of the top conductive layer without removing the etching barrier layer of the portion on which the contact hole of the top conductive layer is to be formed when a storage electrode contact is formed, where the contact hole of the top conductive layer is formed on the top of the bottom conductive layer, which refers to a process of forming the self-alignment contact.

8 Claims, 3 Drawing Sheets

METHOD OF FORMING A CONTACT OF A SEMICONDUCTOR DEVICE

BACKGROUND OF THE INVENTION

1. Field of the Invention

The present invention relates to a method of forming a contact of a semiconductor device, and more particularly to a method of forming a contact of a semiconductor device which can improve a process yield and reliability in accordance with forming a contact hole easily without the process of removing an extra etching barrier as a formation of a contact of an upper conductive layer contact hole located on top of a lower conductive layer under a self-alignment contact process.

2. Description of the Prior Art

In reference, referring to the contact hole connecting the top and bottom conductive wire in the semiconductor device, the size of a hole and the interval between the wires around the hole are reduced, while the aspect ratio, the ratio of a diameter and a depth of the contact hole are increased.

Accordingly, in a highly integrated semiconductor device having conductive wires of multi-layers, an accurate and stern alignment between masks in the fabricating process to form the contact is essential; thus there is a reduction in the processing tolerance state.

The contact hole forms a mask upon considering these main factors: just as a mis-alignment tolerance in aligning masks, a lens distortion at the time of the exposure process, a critical dimension variation at the time of a mask fabrication and photo etching process, and a registration between masks, and etc. in order to maintain the interval thereof.

Further, a self-alignment contact (hereinafter, called SAC) formation technique was developed to overcome the limitation of the lithography process when the contact hole is formed.

In the conventional process of forming the semiconductor device, the contact hole is formed in a manner of self-alignment since the mis-alignment between the upper and lower conductive layers becomes smaller when the contact hole is formed at the substrate of the semiconductor device from the upper conductive layer.

Currently, there is a general method which should prevent shorts between the upper and lower conductive layers, even though mis-alignment occurs since the barrier material to a dry etching is formed at the top of the lower conductive layer.

As explained above, the conventional contact formation method of the semiconductor device has these problems:

In regards to the conventional contact formation method of the semiconductor device, the etching barrier mentioned above functions as the etching barrier when it is necessary that the contact hole is formed from the upper conductive layer to the lower conductive layer. In the actual process, it has an additional process which removes the etching barrier from the portion on which the contact is required for the lower conductive layer from the upper conductive layer when mask process is used separately.

In addition, another problem exists where process yield and reliability deteriorated due to the complicated process because each process is proceeded by referring to the contact formed at the top of the substrate of the semiconductor device from the upper conductive layer, and the contact hole formed to the top of the lower conductive layer.

SUMMARY OF THE INVENTION

Therefore, the object of the invention is to solve the above-mentioned problems involved in the conventional method of forming a contact of a semiconductor device and to provide a method of forming a contact of semiconductor device which can improve a process yield and reliability by simplifying the process of forming a contact hole of an upper conductive layer by removing an etching barrier layer of a portion on which a contact hole of an upper conductive layer is to be formed together with a contact for storage electrode that was formed in case of forming a contact of an upper conductive layer on the top of a lower conductive layer, referring to the process of forming a self-alignment contact.

In accordance with one aspect, the present invention provides a method of forming a contact of a semiconductor device comprising steps of: providing a semiconductor substrate defined as a memory cell portion and a memory cell peripheral portion; patterning upon forming a gate insulating film on the top of the semiconductor substrate, and forming a first conductive layer and a first insulating film on the gate insulating film in series; forming a first spacer to a sidewall of the first insulating film and the first conductive layer patterned; forming an etching barrier layer and a second insulating film in series on the overall surface of the entire structure; forming a first photoresist pattern on the second insulating film in order to form a first contact hole on the memory cell peripheral portion and a storage node contact hole on the memory cell portion; simultaneously forming the first contact hole and the storage node contact hole respectively on the top of the second insulating film of the memory cell portion and memory cell peripheral portion by selectively removing the second insulating film and etching barrier layer using the first photoresist film pattern as a mask; forming a second spacer to the sidewall of the first contact hole and a storage node plug in the storage node contact hole by removing the first photoresist film pattern and forming the conductive layer on the overall surface of the entire structure and etching the entire surface thereof; forming a third insulating film on the surface of the entire structure, and forming a second photoresist film pattern on the third insulating film in order to form a contact between a third conductive layer formed according to the following process and the first conductive layer of the memory cell peripheral portion, and the bit line contact hole of the memory cell portion; simultaneously forming the bit line contact hole and a second contact hole by selectively removing the third insulating film and second insulating film and first insulating using the second photoresist film pattern as a mask; and removing the second photoresist film pattern, forming and patterning the second conductive layer on the surface of the entire structure.

In accordance with another aspect, the present invention provides a method of forming a contact of a semiconductor device comprising steps of: providing a semiconductor substrate defined as a memory cell portion and a memory cell peripheral portion; patterning upon forming a gate insulating film on the top of the semiconductor substrate, and forming a first silicide film and a first silicon nitride film on the gate insulating film in series; forming a first spacer to a sidewall of the first silicide film and first silicon nitride film patterned; forming an etching barrier layer and a first insulating film in series on the overall surface of the entire structure; forming a first photoresist pattern on the first insulating film in order to form a first contact hole on the top of the first silicide film of the memory cell peripheral portion and a storage node contact hole on the memory cell portion; simultaneously forming the first contact hole and the storage node contact hole respectively on the top of the first insulating film of the memory cell portion and memory cell peripheral portion by selectively removing the first insulating film and etching barrier layer using the first photoresist film pattern as a mask; forming a second spacer to the sidewall of the first contact hole and a storage node plug in the storage node contact hole by removing said first photoresist film pattern and forming the conductive layer on the overall surface of the entire structure and etching the entire surface thereof; forming a second insulating film on the surface of the entire structure, and forming a second photoresist film pattern on the second insulating film in order to form a contact between a second silicide film formed according to the following process and the first silicide film of the memory cell peripheral portion, and the bit line contact hole of the memory cell portion; simultaneously forming the bit line contact hole and a second contact hole by selectively removing the second insulating film and first insulating film and first silicon nitride film using the second photoresist film pattern as a mask; and removing the second photoresist film pattern, forming and patterning the second silicide film on the surface of the entire structure.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Hereinafter, a method of forming a contact of a semiconductor device according to the present invention will be explained in detail according to the attached drawings.

FIG. 1 through FIG. 8 are views of the process of forming a contact of a semiconductor device according to the present invention.

Figure 1:
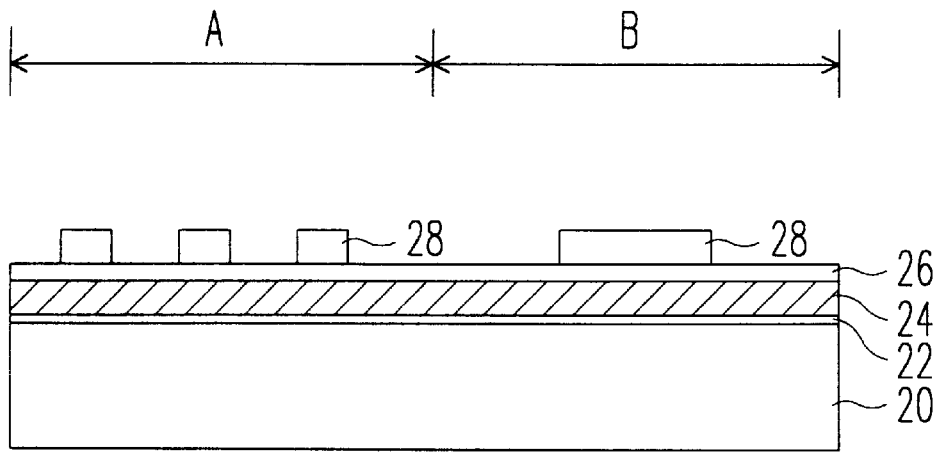
FIG. 1 through FIG. 8 are process views of forming a contact of a semiconductor device according to the present invention.

As shown in FIG. 1, in accordance with the method of forming a contact of a semiconductor device, firstly, a gate insulating film 22, a first conductive layer 24, and a first insulating film 26 are subsequently formed on the top of a semiconductor substrate 20 defined as a memory cell portion A and the cell peripheral circuit portion B.

At this time, the first conductive layer 24 can be formed as a silicon silicide film and the first insulating film 26 can be formed as a silicon nitride film.

In addition, the first insulating film 26 functions as preventing short between layers due to mis-alignment in etching the contact of the following process.

Thereafter, the first photoresist film pattern 28 is formed to the top of the first insulating film 26 in order to pattern the first conductive layer 24.

Figure 2:
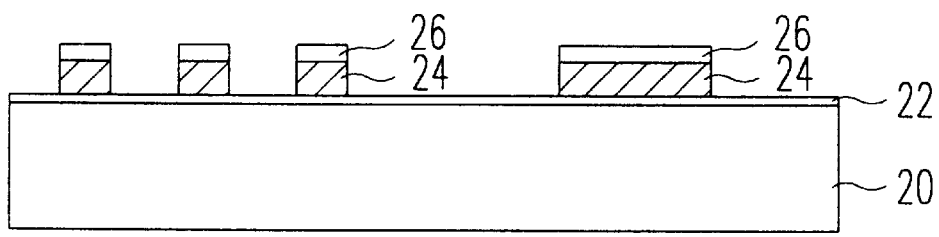

Subsequently, as shown in FIG. 2, the first photoresist film pattern 28 is removed by selectively etching the first insulating film 26 and the first conductive layer 24 until the gate insulating film 22 is exposed using the first photoresist film pattern 28 as a mask.

Figure 3:
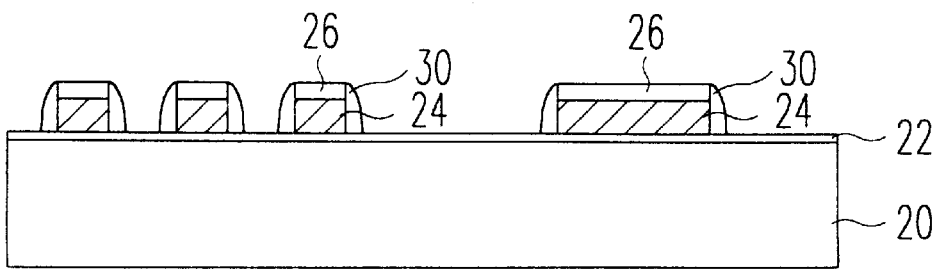
Figure 4:
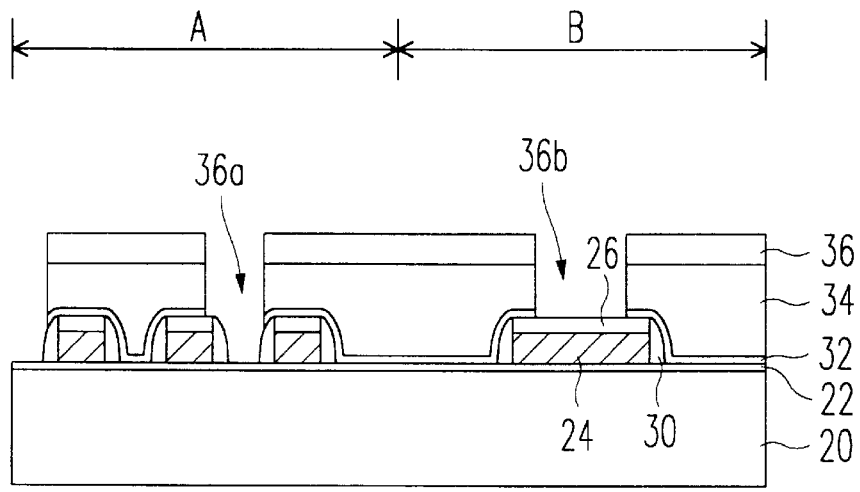

Thereafter, as shown in FIG. 3, a first spacer 30 of a nitride film material is formed at the sidewall of the first conductive layer 24 and the first insulating film 26. Subsequently, as shown in FIG. 4, a second insulating film 32 and a third insulating film 34 are sequentially formed on the exposed surface of the entire structure. At this time, the second insulating film 32 used as an etching barrier layer can be formed as a silicon nitride film.

Then, the second photoresist film 36 is spread on the top of the third insulating film 34 and the second photoresist film pattern 36 is formed on the portion prearranged as the storage electrode contact of the top of the third insulating film 34 by selectively removing the second photoresist film 36.

Thereafter, a storage node contact hole 36a is formed by removing the third insulating film 34 and second insulating film 32 by using of the second photoresist film pattern 36 as a mask.

Then, a first contact hole 36b is formed on the top of the first conductive layer 24 which is positioned on the memory cell peripheral circuit portion B at the time of the formation of the storage node contact hole 36a.

Furthermore, while the contact to the storage node contact hole 36a positioned on the memory cell portion A is formed up to the semiconductor substrate 20, the contact is not formed up to the first conductive layer 24 because the first insulating film 26 is positioned on the first conductive layer 24 of the cell peripheral circuit portion B.

In addition, the second insulating film 32 functions as the etching barrier at the time the dry etching process.

Figure 5:
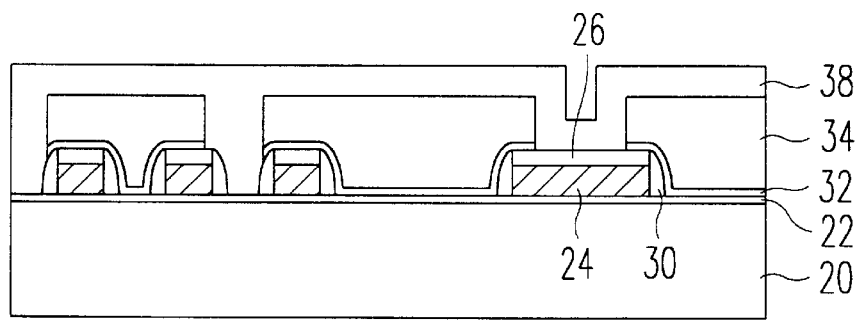

As shown in FIG. 5, the conductive layer 38 is formed in order to form a storage node contact plug on the overall surface of the entire structure.

Then, while the conductive layer 38 is completely filled in the storage electrode contact hole 36a of the memory cell portion A, it is not completely filled in the contact hole 36b which is formed to the peripheral circuit portion B having the contact hole of relatively larger diameter.

Figure 6:
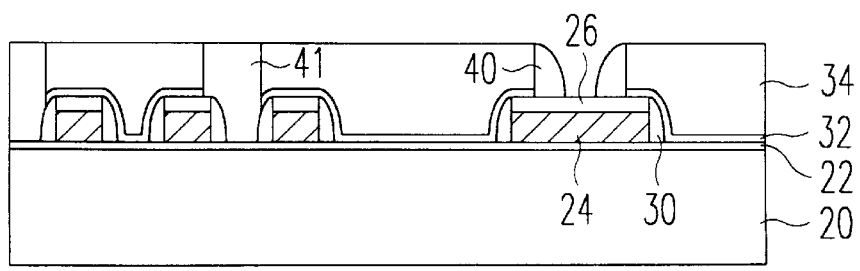

Subsequently, as shown in FIG. 6, a storage contact plug 41 is formed to the storage electrode contact hole 36a of the memory cell portion A by etching the overall surface of the conductive layer 38. A second spacer 40 is formed to the sidewall of the third insulating film 34 of the contact hole 36b which is formed to the peripheral circuit portion B.

Figure 7:
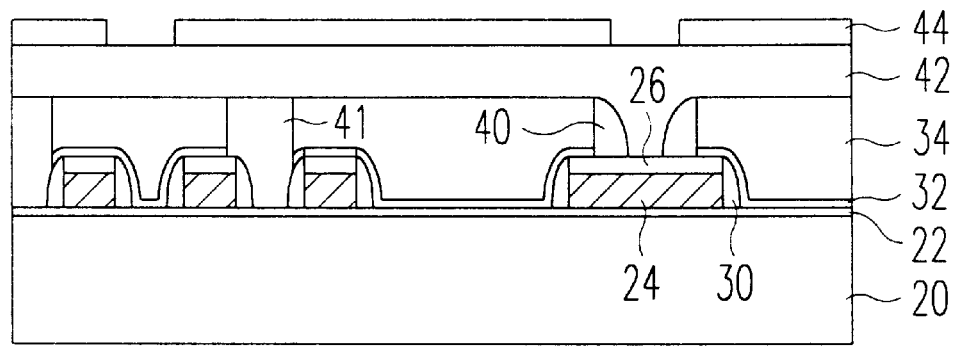

Next, as shown in FIG. 7, a forth insulating film 42 is formed on the overall surface which are exposed on the whole structure, to insulating the top and bottom conductive layers. The third photoresist film 44 is spread on the forth insulating film 42 to form a bit line contact of a memory device. Subsequently, the third photoresist film pattern 44 is formed by selectively removing the third photoresist film which will be left prearranged on a part of the fourth insulating film 42.

Figure 8:
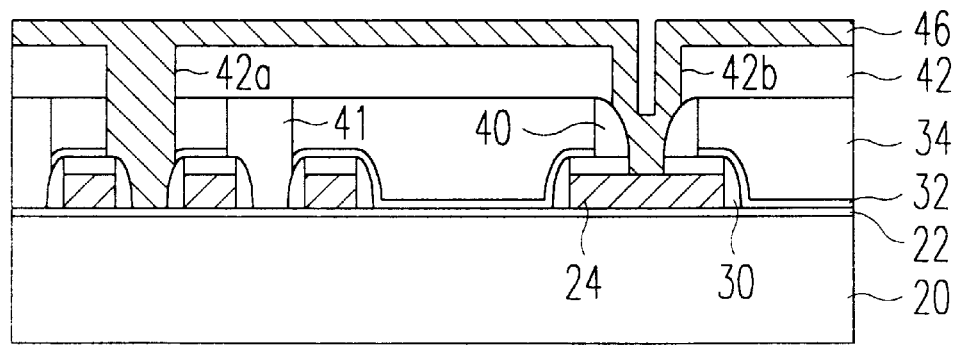

As shown in FIG. 8, a bit line contact hole 42a is formed to the forth insulating film 42 positioned on the memory cell portion A by selectively etching the forth insulating film until the first conductive layer pattern 24 is exposed by using the third photoresist film pattern 44 as a mask.

At this time, a contact hole 42b is formed by removing the first insulating film 26 in the fourth insulating film 42 positioned on the memory cell peripheral portion B where together they simultaneously form the bit line contact hole 42a.

Subsequently, a second conductive layer 46 is formed on the overall surface where it is exposed to the whole structure, accordingly, the semiconductor device is fabricated by proceeding the following process. Thereafter, the second conductive layer 46 can be formed as a silicon silicide film.

As explained above, in accordance with the method of forming a contact of a semiconductor device in regards to the present invention, it has an effect as follows. Referring to a method of forming a contact of a semiconductor device according to the present invention, there can be a simultaneous proceedings by a process of forming a contact between the bottom conductive layer and the top conductive layer in the memory cell peripheral portion, and a process of forming a contact between the semiconductor substrate and the top conductive layer (a bit line contact process) without an extra additional process, by simultaneously being capable of removing the etching barrier layer positioned on top of the bottom conductive layer on which the contact hole of the top conductive layer in the memory cell peripheral portion is to be formed when the storage node contact hole of the memory cell portion is formed. Accordingly, the method of forming a contact of a semiconductor device according to the present invention has an advantage of improving the process yield and reliability by simplifying the process using since the top conductive layer contact hole is easily formed on the bottom conductive layer without removing the extra etching barrier layer, a process of forming the self-alignment contact.

Although the preferred embodiments of the invention have been disclosed for illustrative purposes, those skilled in the art will appreciate that various modifications, additions and substitutions are possible without departing from the scope and spirit of the invention as disclosed in the accompanying claims.

What is claimed is:

1. A method of forming a contact of a semiconductor device comprising steps of:
   providing a semiconductor substrate defined as a memory cell portion and a memory cell peripheral portion;
   sequentially forming a gate insulating film, a first conductive layer and a first insulating film on top of the semiconductor substrate;
   patterning said gate insulating film, said first conductive layer and said first insulating film;
   forming a first spacer at a sidewall of said first insulating film and said first conductive layer patterned;
   sequentially forming an etching barrier layer and a second insulating film on the exposed surface of the entire structure;
   forming a first photoresist pattern on said second insulating film;
   simultaneously forming the first contact hole and the storage node contact hole respectively on the top of said second insulating film disposed on the memory cell portion and memory cell peripheral portion by selectively removing said second insulating film and etching barrier layer by using the first photoresist film pattern as a mask;
   forming said first photoresist film pattern;
   forming a conductive layer on the exposed surface of the entire structure;
   etching said conductive layer, to form a second spacer to the sidewall of said first contact hole and a storage node plug in the storage node contact hole;
   forming a third insulating film on the surface of the entire structure, and forming a second photoresist film pattern on said third insulating film in order to form a contact between a third conductive layer formed according to the following process and said first conductive layer disposed on the memory cell peripheral portion, and the bit line contact hole of the memory cell portion;
   simultaneously forming the bit line contact hole and a second contact hole by selectively removing said third insulating film and second insulating film and first insulating film by using said second photoresist film pattern as a mask; and
   removing said second photoresist film pattern, and forming and patterning the second conductive layer on the surface of the entire structure.

2. The method according to claim 1, wherein said first insulating film is formed of a silicon nitride film.

3. The method according to claim 1, wherein said first spacer is formed of a silicon nitride film.

4. The method according to claim 1, wherein said etching barrier layer is formed of a silicon nitride film.

5. The method according to claim 1, wherein said first conductive layer is formed of a silicide film.

6. The method according to claim 1, wherein said second conductive layer is formed of a silicide film.

7. A method of forming a contact of a semiconductor device comprising steps of:
   providing a semiconductor substrate defined as a memory cell portion and a memory cell peripheral portion;
   sequentially forming a gate insulating film, a first silicide film and a first silicon nitride film on said semiconductor substrate;
   patterning said gate insulating film, said first silicide film and said first silicon nitride film;
   forming a first spacer at sidewall of said first silicide film and first silicon nitride film patterned;
   sequentially forming an etching barrier layer and a first insulating film on the exposed surface of the entire structure;
   forming a first photoresist pattern on said first insulating film;
   simultaneously forming the first contact hole and the storage node contact hole respectively on the top of said first insulating film of the memory cell portion and memory cell peripheral portion by selectively removing said first insulating film and etching barrier layer by using the first photoresist film pattern as a mask;
   removing said first photoresist film pattern and forming a conductive layer on the exposed surface of the entire structure;
   etching the entire surface of said conductive layer, to form a second spacer at the sidewall of said first contact hole and a storage node plug in the storage node contact hole;
   forming a second insulating film on the surface of the entire structure, and forming a second photoresist film pattern on said second insulating film in order to form a contact between a second silicide film formed according to the following process and said first silicide film disposed on the memory cell peripheral portion, and the bit line contact hole disposed on the memory cell portion;
   simultaneously forming the bit line contact hole and a second contact hole by selectively removing said second insulating film and first insulating film and first silicon nitride film by using said second photoresist film pattern as a mask; and
   removing said second photoresist film pattern, and forming and patterning the second silicide film on the surface of the entire structure.

8. The method according to claim 7, wherein said first spacer is formed of a silicon nitride film.

* * * * *